United States Patent [19]
Birrittella et al.

[11] Patent Number: 4,631,570
[45] Date of Patent: Dec. 23, 1986

[54] INTEGRATED CIRCUIT HAVING BURIED OXIDE ISOLATION AND LOW RESISTIVITY SUBSTRATE FOR POWER SUPPLY INTERCONNECTION

[75] Inventors: Mark S. Birrittella, Phoenix; Robert H. Reuss, Scottsdale; Walter C. Seelbach, Fountain Hills, all of Ariz.

[73] Assignee: Motorola, Inc., Schaumburg, Ill.

[21] Appl. No.: 628,019

[22] Filed: Jul. 3, 1984

[51] Int. Cl.$^4$ .................. H01L 27/12; H01L 27/02
[52] U.S. Cl. .......................... 357/49; 357/43; 357/44; 357/34; 307/303
[58] Field of Search ............ 357/49, 43, 44, 34; 307/303

[56] References Cited

U.S. PATENT DOCUMENTS

| | | | |
|---|---|---|---|
| 4,054,899 | 10/1977 | Stehlin et al. | 357/44 |
| 4,255,209 | 3/1981 | Morcom et al. | 357/49 |
| 4,564,853 | 1/1986 | Van Zanten | 357/44 |

Primary Examiner—Martin H. Edlow
Assistant Examiner—Terri M. Henn
Attorney, Agent, or Firm—William E. Koch

[57] ABSTRACT

An integrated circuit power supply interconnection technique is disclosed having a highly doped, low resistivity substrate for distribution of the integrated circuit's most positive supply voltage. The substrate functions as the most positive voltage point and accomodates devices that are normally connected directly to this most positive supply voltage. A dielectric buried layer overlies a portion of the substrate and isolates the substrate supply voltage from devices that are not connected directly to the most positive supply voltage.

1 Claim, 2 Drawing Figures

INTEGRATED CIRCUIT HAVING BURIED OXIDE ISOLATION AND LOW RESISTIVITY SUBSTRATE FOR POWER SUPPLY INTERCONNECTION

BACKGROUND OF THE INVENTION

1. Field of the Invention

This invention relates generally to integrated circuits and, more particularly, to an integrated circuit power supply interconnection technique using a low resistivity substrate and a buried oxide isolation layer.

2. Background Art

Semiconductor integrated circuits include a plurality of transistors, diodes, and the like formed by creating a variety of doped regions in a semiconductor wafer substrate. These regions are formed by performing a number of operations, for example, epitaxial growth, diffusions, ion implantations, etching processes, etc. These operations normally are carried out by a number of masking steps. The devices are then interconnected by a conductive metallization layer to form the desired circuit function.

In prior art structures, it has been conventional for chip power to be distributed by use of two or more metal power busses that lie in close proximity and crossover signal carrying metal conductors. However, this procedure results in a complex metalization layout due to the number of connections on top of the integrated circuit. Also, as integrated circuits increase in complexity, the amount of metal overlying the regions increases. This increases the capacitance, especially as the operating current requirements increase. Furthermore, each power supply voltage metallization line that crosses over a signal metallization line creates additional capacitance.

These prior art structures comprised a substrate having high resistivity (low doping). However, a high resistivity substrate has a decreased radiation hardness.

Thus, an integrated circuit power supply interconnection technique is needed that decreases the number of metal power busses on top of the chip, reduces capacitance and improves radiation hardness.

SUMMARY OF THE INVENTION

Accordingly, it is an object of the present invention to provide an improved integrated circuit.

Another object of the present invention is to provide an integrated circuit which utilizes a power supply interconnection technique having a low resistivity substrate and a buried dielectric isolation layer.

A further object of the present invention is to provide an integrated circuit power supply technique that reduces the number of metal power busses on top of the chip.

Still another object of the present invention is to provide an integrated circuit having reduced capacitance between power busses and signal lines.

Yet another object of the present invention is to provide an integrated circuit having increased radiation hardness.

In carrying out the above and other objects of the invention in one form, there is provided a monolithically integrated circuit structure having a highly doped, low resistivity substrate for distribution of the integrated circuit's most positive supply voltage. The substrate functions as the most positive voltage point and accomodates devices that are normally connected directly to this most positive supply voltage. Dielectric buried layer overlies a portion of the substrate and isolates the substrate supply voltage from devices that are not connected directly to the most positive supply voltage. This concept is applicable to any integrated circuit using bipolar technology.

The above and other objects, features, and advantages of the present invention will be better understood from the following detailed description taken in conjunction with the accompanying drawings.

DETAILED DESCRIPTION OF THE INVENTION

Figure 1:
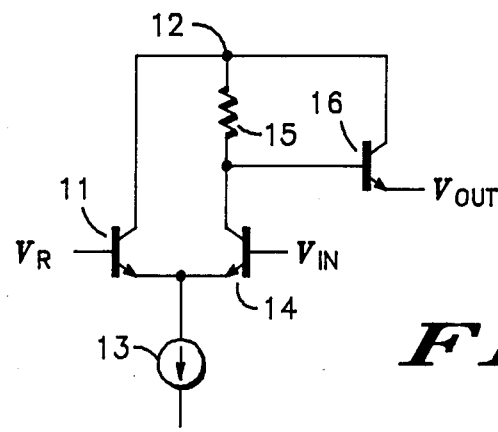
FIG. 1 is a schematic of a known logic circuit that includes semiconductor devices used to illustrate the invention.
Figure 2:
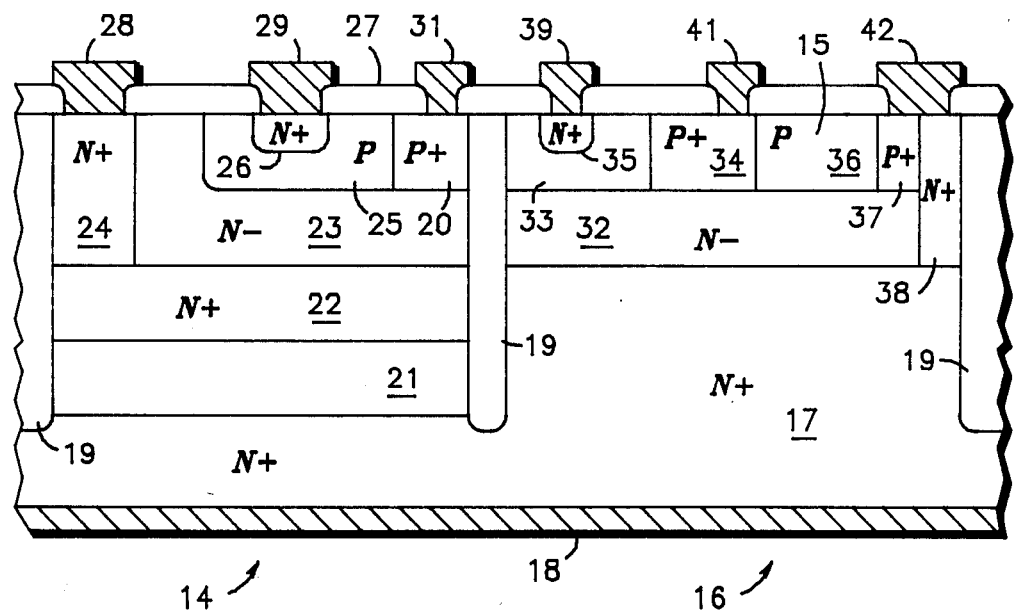
FIG. 2 is a cross section of the semiconductor die illustrating the preferred embodiment.

FIG. 1 shows a conventional ECL logic gate that will assist in explaining the invention illustrated in FIG. 2. NPN transistor 11 has a collector connected to supply voltage terminal 12, an emitter connected to current source 13, and a base coupled to receive reference voltage $V_R$. NPN transistor 14 is differentially connected to transistor 11 and has a collector coupled to supply voltage terminal 12 by resistor 15, an emitter connected to current source 13, and a base coupled to receive input signal $V_{IN}$. Emitter follower NPN transistor 16 has a collector connected to supply voltage terminal 12, an emitter coupled to supply output signal $V_{OUT}$, and a base connected to the collector of transistor 14. This logic gate operates in a manner well known to those skilled in the art.

FIG. 2 illustrates, in cross-section, a portion of a semiconductor structure in accordance with the invention. The structure includes transistors 14 and 16 and resistor 15 of FIG. 1. It is to be understood that the invention illustrated in FIG. 2 may be configured with NPN or PNP transistors, with or without resistors, and for circuits other than logic gates. The logic gate of FIG. 1 is used for illustration purposes only.

An N+ substrate 17 has metallization contact 18 contiguous thereto for connecting to a power supply voltage $V_{CC}$. Substrate 17 is highly doped and therefore has a low resistivity for providing the supply voltage $V_{CC}$ at any location on the chip. The two portions of the structure comprising transistors 14 and 16 are electrically isolated from the remaining chip and each other by recessed oxide or diffused isolations 19 which extends into the N+ substrate 17. Alternate isolation techniques, i.e., an etched groove, may be used.

Buried insulating layer 21 is formed by selectively implanting ions, i.e., oxygen, nitrogen, within substrate 17 and is located between isolations 19 for the portion of the chip comprising transistor 14. N+ layer 22 is a portion of substrate 17 that remains above buried layer 21. Buried layer 21 is positioned between isolation regions 19 so as to electrically isolate substrate 17 from layer 22. Overlying N+ layer 22 is grown N− epitaxial layer 23. An N+ region 24 is diffused into N− epitaxial layer 23 and to N+ layer 22, and together with layers 22 and 23 serve as the collector of transistor 14. P region 25 is ion implanted into N− epitaxial layer 23 and serves as the base of transistor 14. N+ region 26 is diffused into P region 25 and serves as the emitter of transistor 14. P+ region 20 is ion implanted into P region 25 for providing the base contact for transistor 16. Dielectric layer 27 overlies the chip in a manner well known to those skilled in the art. Metallization 28 overlies N+ region 24, metallization 29 overlies N+ region 26, and metallization 31 overlies P region 25 for providing the collector, emitter, and base contacts, respectfully, for transistor 14.

The region comprising N+ buried layer 22 and dielectric buried layer 21 can also be fabricated by forming dielectric buried layer 21 over substrate 17. The insulating layer 21 is formed by standard pattern formation techniques. N+ buried layer 22 is formed by depositon and doping of silicon which selectively grows laterally over dielectric buried layer 21 from substrate 17.

Referring now to the portion of the chip that comprises transistor 16, it is seen that N− epitaxial layer 32 overlies N+ substrate 17, and therefore is coupled to supply voltage $V_{CC}$ applied to substrate 17 and serves as the collector of transistor 16. Ion implanted P region 33 and ion implanted P+ region 34 overlie N− epitaxial layer 32 and serve as the base of transistor 16. N+ region 35 is diffused into P region 33 and serves as the emitter of transistor 16. P region 36 is ion implanted into N− epitaxial layer 32 and serves as resistor 15. Ion implanted P+ region 37 enhances contact to the metallization. N+ region 38 is diffused through N− epitaxial layer 32 to N+ substrate 17. Metallization 39 overlies N+ region 35 and metallization 41 overlies P+ region 34 for providing the emitter and base contacts, respectively, for transistor 16. Metallization 42 overlies P+ region 37 and N+ region 38 for providing supply voltage $V_{CC}$ at one end of resistor 15.

In summary, N+ substrate 17 is a highly doped, low resistive material that provides a supply voltage to the chip instead of routing the supply voltage across the top of the chip through the metallization. The supply voltage may be isolated from a device on the chip by buried dielectric layer 21 that has been ion implanted into the substrate 17.

By now it should be appreciated that there has been provided an improved integrated circuit power supply interconnection technique using a low resistivity substrate and a buried oxide isolation layer. This technique reduces the number of power busses on top of the chip, reduces capacitance, and improves radiation hardness of the chip.

We claim:

1. A monolithic semiconductor integrated circuit structure, comprising:
   a plurality of islands, each of said islands comprising at least one semiconductor device;
   a substrate of a first conductivity type for coupling to a voltage supply;
   a first region comprising a dielectric material formed between said substrate and at least one of said plurality of islands of isolating said voltage supply from said at least one of said plurality of islands;
   a second region having said first conductivity type and having a first portion epitaxially grown above said first region and a second portion epitaxially grown between said substrate and another of said plurality of islands;
   a third region having a second conductivity type formed at a surface of said first portion of said second region;
   a fourth region having said first conductivity type formed at a surface of said third region, said first portion of said second region, and said third and fourth regions forming a first semiconductor device;
   a fifth region having said second conductivity type epitaxially grown on a surface of said second portion of said second region;
   a sixth region having said first conductivity type epitaxially grown on a surface of said fifth region, said second portion of said second region, and said fifth and sixth regions forming a second semiconductor device;
   a seventh region having said second conductivity type, formed at a surface of a third portion of said second region and adjacent to said fifth region; and
   an eighth region having said first conductivity type formed at a surface of said substrate and extending adjacent to said second and seventh regions.

* * * * *